United States Patent [19]
Deligianni et al.

[11] Patent Number: 5,874,199
[45] Date of Patent: Feb. 23, 1999

[54] METHOD OF FORMING OVERSIZED SOLDER BUMPS

[75] Inventors: Hariklia Deligianni, Edgewater, N.J.; William Hsioh-Lien Ma, Fishkill, N.Y.

[73] Assignee: International Business Machines Corporation, Armonk, N.Y.

[21] Appl. No.: 946,797

[22] Filed: Oct. 8, 1997

Related U.S. Application Data

[63] Continuation of Ser. No. 565,494, Nov. 30, 1995.

[51] Int. Cl.⁶ ........................................ G03C 5/00
[52] U.S. Cl. .................. 430/312; 430/323; 430/313; 430/329
[58] Field of Search .................... 430/312, 323, 430/313, 329

[56] References Cited

U.S. PATENT DOCUMENTS

| | | | |
|---|---|---|---|
| 4,661,375 | 4/1987 | Thomas | 427/89 |
| 5,024,372 | 6/1991 | Altman et al. | 228/248 |
| 5,346,118 | 9/1994 | Degani et al. | 228/180.22 |
| 5,376,584 | 12/1994 | Agarwala | 437/183 |
| 5,381,848 | 1/1995 | Trabucco | 164/102 |
| 5,381,946 | 1/1995 | Koopman et al. | 228/254 |
| 5,635,337 | 6/1997 | Bartha et al. | 430/323 |
| 5,789,142 | 8/1998 | Brown et al. | 430/315 |

FOREIGN PATENT DOCUMENTS

| | | |
|---|---|---|
| 0248314 | 5/1987 | European Pat. Off. . |
| 2-114644 | 4/1990 | Japan . |
| 2-230740 | 9/1990 | Japan . |
| 63-10514 | 11/1994 | Japan . |
| 6310514 | 11/1994 | Japan . |

*Primary Examiner*—Janet Baxter
*Assistant Examiner*—Rosemary Ashton
*Attorney, Agent, or Firm*—Whitham, Curtis & Whitham; Aziz Ahsan, Esq.

[57] ABSTRACT

Ball limited metallurgy is used in conjunction with defining a solder deposit volume using an aperture in a resist layer and reflow of electroplated solder materials deposited in that aperture, possibly with planarization after deposition to enhance volume accuracy, to develop solder deposits extending up to 10 $\mu$m or more above the surface on which solder is deposited. Such deposits can be made at fine pitch and provide solder connections of high reliability even when the distance which must be bridged by the solder connection is not easily or reliably regulated.

6 Claims, 2 Drawing Sheets

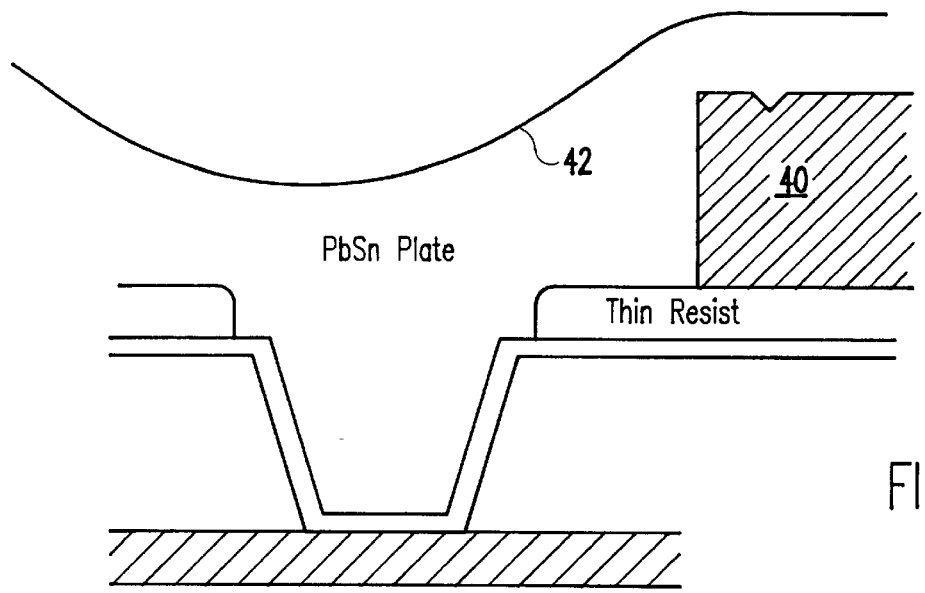
FIG.4
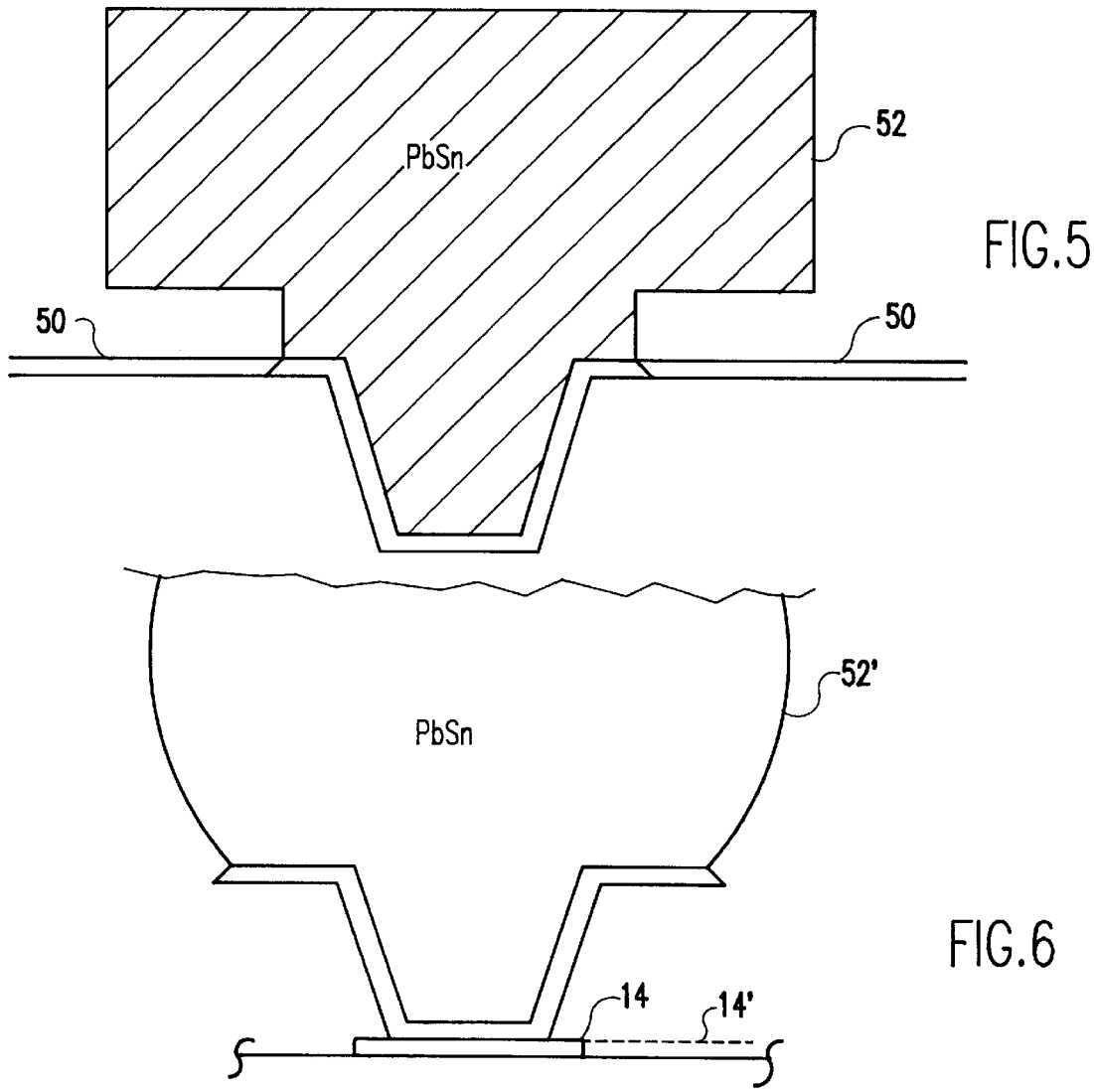
FIG.5
FIG.6

METHOD OF FORMING OVERSIZED SOLDER BUMPS

This application is a continuation of application Ser. No. 08/565,494, filed Nov. 30, 1995.

BACKGROUND OF THE INVENTION

1. Field of the Invention

The present invention generally relates to the fabrication of electronic circuit devices and, more particularly, to the in-situ formation of solder deposits especially of a size appropriate to solder connections between carriers or substrates and chips or other substrates or carriers where a significant gap may exist.

2. Description of the Prior Art

Formation of electrical and mechanical connections between elements of an electronic device has long been known, particularly for attachment of discrete components and integrated circuits to carriers such as printed circuit boards. As component sizes have been reduced and in the course of production runs of particular electronics devices and portions thereof, many sophisticated techniques for forming such connections by soldering have been developed, particularly for forming numerous connections concurrently and at close spacing.

In particular, in modular circuit packaging, in which numerous connections are formed in layers on lamina which are later stacked and sintered or otherwise fused to provide a complex interconnection structure for the interconnection of numerous integrated circuit chips which may be mounted thereon, soldering techniques have been developed by which the chips can be mechanically mounted and also form potentially thousands of connections to each chip in a very closely spaced array. For this purpose, the technique of application of solder materials and flux has become quite critical, particularly as to volume of solder materials. If too much solder is used, the solder material may form unwanted bridges between closely spaced conductors and/or connection pads. If too little solder is used, the mechanical and/or electrical integrity of the connection may be severely compromised, if a solder connection can be formed at all.

Generally the amount of solder required for a particular connection depends on the area of the connection and the physical proximity of the surfaces which are to be connected. Solder can successfully bridge relatively small gaps and, by adjustment of solder-wettability of surface surrounding the connection, solder flow can generally be well-controlled within the boundaries of the surfaces to be connected and which must necessarily be solder wettable. However, the volume of solder, if too great for a given area and surface separation, may be sufficient to cause solder flow across surfaces which are not solder wettable. Conversely, if the separation of surfaces is too great to be bridged by the volume of solder available, the solder will merely form bumps on the solder wettable surfaces to the limit of the solder volume without making a connection therebetween.

Generally, the surfaces to be connected by solder can be placed in sufficiently close proximity for connections to be made with very small volumes of solder materials. Such volumes of solder materials have been dispensed as a paste, containing particles of solder as a fine powder in a binder, by screening techniques, often using masks, as solder preforms such as the so-called C4 preform which may be appropriately placed and then caused to collapse in a controlled fashion upon application of heat. Production, use and rework of C4 solder deposits are discussed in detail on pages 366–391 of "Microelectronics Packaging Handbook" edited by R. R. Tummala et al., Van Nostrand Reinhold, N.Y., 1989.

More recently, solder materials have been deposited by evaporation or electroplating of solder materials. Electroplating is rapidly becoming a technique of choice for extremely close connection spacings possible at the present state of the art principally because lithographic techniques can assure that solder is placed at all desired locations while closely limiting the possibility that any solder materials at all will be placed at any other location.

As is known in the art, electroplating of solder materials requires the formation of common connections to all locations which are to be electroplated with solder materials with specific locations to which solder is to be electroplated exposed with a dielectric resist mask. The volume and height of the solder materials deposited is generally limited by the thickness of the resist used. Currently available resists can provide solder bump height of about 4 to 5 mils which is sufficient for most application. However, thicker resists are not readily available and, in any event, cause difficulty in lithographic exposure and patterning since the energy of exposures sufficient to expose a greater thickness of resist is also scattered within the resist, causing inaccuracy of the outline of the exposure pattern and the shape of the profile of the resist at apertures which adversely affects the accuracy of the solder volume deposited. Further, the masking and patterning may be compromised by inaccuracy of registration of the exposure for patterning the resist; causing inaccuracy of position of the deposited solder materials, particularly near the maximum resist thickness available.

Recently, some technologies have been developed which, while providing distinct and substantial advantages in circuit performance and package capacity (in terms of the number of circuits which may be included therein) as well as in chip integration density, present substantial new difficulties in formation of solder connections. In particular, circuit packages having connections made to edges of chips have become known in which solder bumps on a chip edge are pushed onto pins attached to the substrate. The so-called Single Inline Memory Module (SIMM) is exemplary of this type of package. However, in this and other types of edge connection packaging, due to difficulties of alignment and irregularities of chip edge geometry, particularly where several chips may be joined together prior to connection to a carrier, a maximum spacing of 4–5 mils between a contact surface thereof and a connection surface of a substrate to which it is to be electrically and mechanically attached cannot be maintained. A solder bump height of 10 mils is considered to be required for formation of reliable solder connections having such geometries.

Nevertheless, the pitch of connections thereto must approach the pitch of connections to integrated circuits formed and or mounted in accordance with other technologies in order to exploit the potential integration density available in those technologies. Accordingly, forming solder deposits by electroplating has not been feasible since greater volumes of solder, higher dimensional extent above the carrier and higher geometrical accuracy of solder bumps is required to form connections than can be accommodated by thicknesses of currently available resists. At the same time, the pitch of connection pads closely approaches the limits at which solder connections can be reliably formed using preforms or by screening of solder materials and at which additional and unintended amounts of solder material can severely compromise manufacturing yield.

Accordingly, a need exists for accurate deposition of larger volumes of solder and with a greater dimensional extent above a surface than is available with currently available processes.

SUMMARY OF THE INVENTION

It is therefore an object of the present invention to provide a technique of placement of solder materials with high positional and geometric accuracy while avoiding deposits of solder materials at unintended locations.

It is another object of the invention to provide a technique of electroplating large solder volumes independently of resist thickness and registration accuracy of resist patterning.

It is a further object of the invention to provide a method of forming solder deposits having a height in excess of available resist thickness and approaching if not exceeding ten mils.

In order to accomplish these and other objects of the invention, a method of forming solder deposits of increased height is provided including the steps of depositing a conductive layer on a surface, depositing and patterning a first resist layer on the conductive layer to form first apertures therein, depositing a ball limited metallurgy material on surfaces of the patterned first resist layer, the ball limited metallurgy material being solder wettable and selectively etchable without significant etching of solder materials, depositing and patterning a second resist layer over said ball limited metallurgy material, the patterning of the second resist layer forming second apertures in registration with but larger than the first apertures, defining solder deposit volumes with apertures in a third resist layer, the apertures in the third resist layer being overlapped with apertures in the second resist layer, electroplating solder materials in apertures in the second and third resist layers to form solder deposits, stripping the second and third resist layers, selectively etching exposed portions of the ball limited metallurgy material, and reflowing the solder deposits in accordance with remaining ball limited metallurgy material.

In accordance with another aspect of the invention, a method of increasing height of an electroplated solder deposit is provided including the steps of defining a volume of a solder deposit with an aperture in a resist layer overlapping an exposed area of a deposit of ball limited metallurgy material, depositing solder materials in the aperture in the resist layer, and reflowing the solder materials in accordance with the exposed areas of ball limited metallurgy materials.

BRIEF DESCRIPTION OF THE DRAWINGS

The foregoing and other objects, aspects and advantages will be better understood from the following detailed description of a preferred embodiment of the invention with reference to the drawings, in which:

FIGS. 2, 3, 4 and 5 show, in cross-sectional view, intermediate stages in formation of a solder deposit in accordance with the invention, and FIG. 6 shows, in cross-section, the completed solder bump in accordance with the invention.

DETAILED DESCRIPTION OF A PREFERRED EMBODIMENT OF THE INVENTION

Figure 1:
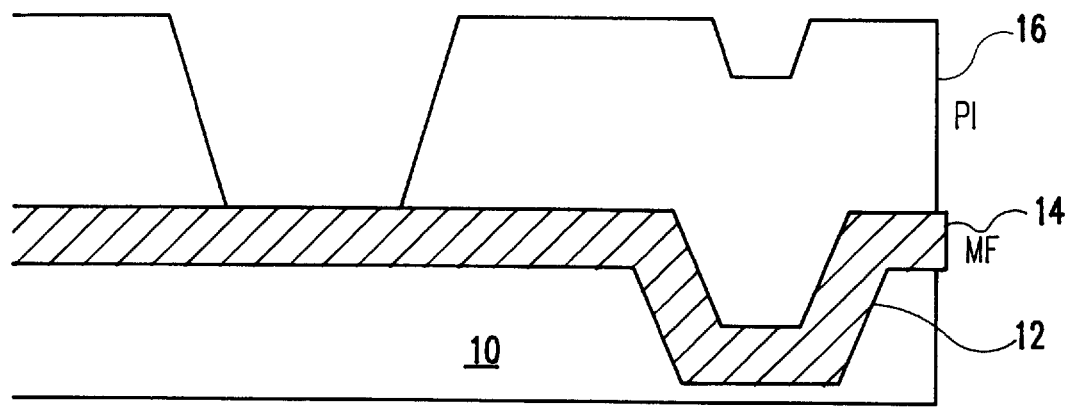
FIG. 1 is a cross-sectional view of an initial deposit on a substrate at a location where a solder deposit in accordance with the invention is to be formed.

Referring now to the drawings, and more particularly to FIG. 1, there is shown, in cross-section, an initial deposit on a surface where a solder bump in accordance with the invention is to be formed. Layer 10 can be a substrate or chip carrier or a chip, itself, and may have been processed through any number of steps in accordance with formation of circuit elements or connections therein or thereon. The surface may be highly irregular as schematically indicated at 12, as might, for example, occur on the top surface of a chip after formation of numerous transistors, connections and/or other structures such as isolation trenches or capacitors thereon. It will be noted in the following description of the invention that this formation neither interferes with nor takes any part in the formation of solder bumps and, hence, is an indication of the wide applicability of the invention.

The structure shown in FIG. 1 assumes the formation of a metal film 14 which will form an electrical connection for electroplating. (After it has performed this function, it can be etched in accordance with the circuit design in a manner not critical to the practice of the invention. However, if the patterning principally provides connection pads, only relatively simple masking is necessary since patterning of connection pads can be performed using the electroplated solder as the mask or as a portion thereof.) The thickness of metal film 14 is relatively unimportant as long as it is sufficient relative to its lateral extent and the number of solder bumps to be formed to carry electroplating current without significant voltage drops which could cause non-uniformities of the electroplated film. The deposition of metal film 14 is followed by a patternable resist film 16 such as a photosensitive polyimide of known positive or negative type. The thickness of the resist film 16 is also unimportant to the practice of the invention.

Figure 2:
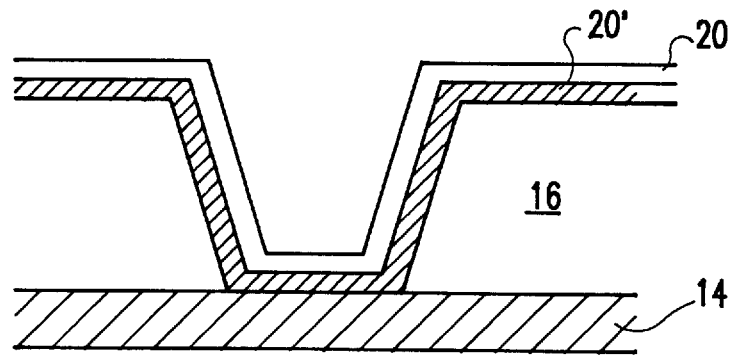

After resist film 16 is patterned, as assumed in the illustration of FIG. 1, to open the resist by known so-called personalization processes such as Back End of Line (BEOL) processes, to metal film 14 at desired locations of solder deposits (which may be done with high accuracy since a thick film is not required) the structure is sputter cleaned and one or more thin films 20', 20' of metals or metal alloys such as TiW, CrCu or Cu are deposited, such as by seeding and electroless deposition, sputtering deposition, electroplating, etc., as shown in FIG. 2, as is preferred or by electroplating or other deposition techniques. Other metals such as Cr, Ni, Co, Au, Pt, and Pd and alloys and layered structures thereof, including the above metals and alloys are also suitable to the practice of the invention. The choice of these metals is of some importance to the practice of the invention and should conform to known so-called ball limited metallurgy (BLM) by exhibiting a wettability such as to support reflowing of solder materials to the limit of their exposed extent as well as being readily and anisotropically etchable by techniques and chemicals which will not significantly attack solder materials.

Figure 3:
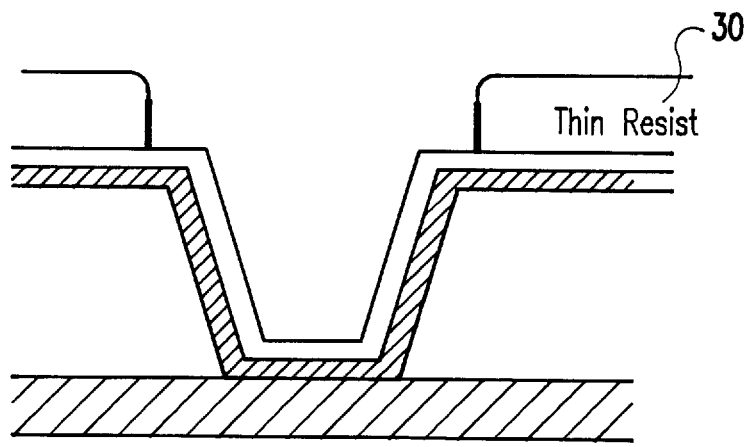

Next, as shown in FIG. 3, a thin resist layer 30 is applied and patterned. Spin-on resists as are known and in common use in semiconductor processes are preferred for resolution accuracy. Such a resist is baked after application then exposed and patterned and again baked in a known fashion. The mask used for exposure is substantially the same as used in the patterning of resist layer 16 but, preferably, with larger openings corrected for the final design requirements. In this context, correction of openings considers mask registration windage or bias and accommodates for process variation and practical process control limitations in lithographic exposure and development. The accuracy of this patterning is a key step in the process in accordance with the invention since it defines the final BLM pad size and thus the shape of the solder bump for any given volume of solder materials as will be established during the portion of the process depicted in FIG. 4.

The structure is then laminated with a dry film resist layer 40 about 4–5 mils in thickness which is then exposed and patterned by development. Such resists are commercially available at the present time. This type of resist is preferred since it is made available in rolled sheets suitable for lamination and can be of somewhat greater thickness than other resists applicable in a liquid form. In sheet form, scattering of patterning radiation within the resist can be controlled somewhat more readily. Other and or thinner resists, whether or not formed in sheets, are potentially usable in the practice of the invention but thinner resists may present difficulties in stripping, as will be described below, or require areas to develop adequate solder volume which are not compatible with required solder bump pitch.

Again, the mask used for patterning resist layer 40 is similar to that used for patterning of resist layers 16 and 30 but arranged to provide enlarged exposure areas corresponding to larger openings formed during patterning thereof. This patterning is also corrected, as with exposure of resist layer 30, and to adjust final solder deposit volume which, in turn and in accordance with the area of layer or layers 20, 20' exposed by resist 30 (or remaining after resist stripping and etching), will establish final solder bump height.

However, in contrast with the patterning of resist layers 16 and 30, registration is not critical to the final solder bump formation or positional accuracy thereof as will be explained in more detail below. That is, the patterning of layer 30 to expose the BLM layers 20, 20' determines the location of the solder bump and, in conjunction with the volume determined by the apertures in the dry film resist, determines the size, shape and height of the final solder bump. The apertures in the resist layer 40 thus serves, during electroplating, only to define the volume of the solder deposit which will later be self-relocating in accordance with BLM techniques.

Thus, it is only necessary that apertures in resist layer 40 overlap apertures in resist layer 30 to some degree and registration accuracy is not otherwise critical to the practice of the invention. Then, solder materials are electroplated in the aperture to approximately the surface of dry film resist 40 as shown by dashed line 42. Planarization may be employed for increasing accuracy of the volume of solder materials deposited, as shown by the shape of solder deposit 52 in FIG. 5.

Then, as further shown in FIG. 5, all resist material in layers 40 and 30 is stripped leaving the deposit of electroplated solder material above the BLM metallurgy layer(s) 20, 20'. It should be noted that a portion 50 of the BLM metallurgy will be exposed below the deposit of solder materials; the exposed portions of which can then be etched in a generally anisotropic fashion by known techniques. The degree of anisotropy of such an etch is not particularly critical to the practice of the invention since BLM layers are preferably very thin and any undercutting of unexposed BLM layers will be limited to approximately the thickness of the layers (assuming good end-point determination) even if the etching process is wholly isotropic.

As shown in FIG. 6, the deposit of solder materials is attached to the layer 10 only at the location of remaining portions of the BLM layers. Therefore, upon application of heat, the solder will reflow into a largely spherical solder bump or ball, under the effects of surface tension in the solder materials. The vertical extent of the reflowed solder deposit determined by the deposited solder volume and the remaining area of BLM layer or layers 20, 20' can be far greater than the total thicknesses of all resist layers employed in the fabrication process described above. During such solder reflow, the solder will realign with the remaining BLM layer portions due to the same effects.

It should be noted that the state of the structure at this point in the solder deposition process is substantially the same as that of FIG. 2 except for the reflowed solder deposit 52' and the removal of BLM layer(s) 20, 20' where those layers are not masked by the solder deposits. That is, resist layer 16 is again exposed and can be stripped either fully or selectively (using a further mask, if necessary) and conductive layer 14 can be patterned (e.g. 14') by a selective etch which does not significantly attack the solder deposits. Generally, only connection pads are formed from layer 14 and no patterning of layer 14 other than the masking provided by the solder deposits will be required. In this case, all of layer 14 will be removed except in the locations where solder deposits have been formed.

In view of the foregoing, it is seen that the invention provides for the formation of solder bumps having a height above underlying structure which may be far in excess of the available and accurately patternable thicknesses of resist. Location and height are determined in separate resist patterning processes and registration accuracy is not required in the patterning which determines height and which would be of increased difficulty in view of the increased opening size.

While the invention has been described in terms of a single preferred embodiment, those skilled in the art will recognize that the invention can be practiced with modification within the spirit and scope of the appended claims. For example, different height of solder deposits can be achieved by variation of the size of apertures patterned in resist layer 40 or by variation of the apertures patterned in resist layer 30 or a combination of both. This also allows solder deposits of different final heights to be developed in the same process, if found desirable in certain applications. Shapes of openings in the thick resist layer can be varied to accommodate high solder connection pitch. Alternatively, it should be recognized that if resist layer 40 is not solder wettable, reflow of solder will cause increase in solder deposit height even if resist layer 40 (and/or resist layer 30) is not removed prior to reflow or at all. However, conductive layer 14 could not then be patterned and patterning must be otherwise provided. In such a case, resist layer 40 could serve to confine solder during adverse and high temperature operating conditions of the device.

Having thus described my invention, what we claim as new and desire to secure by letters Patent is as follows:

1. A method of forming solder deposits of increased height including the steps of depositing a conductive layer on a surface, depositing and patterning a first resist layer on said conductive layer to form first apertures therein, depositing a ball limited metallurgy material on surfaces of said patterned first resist layer, said ball limited metallurgy material being solder wettable and selectively etchable with respect to solder materials, depositing and patterning a second resist layer over said ball limited metallurgy material, said patterning of said second resist layer forming second apertures in registration with said first apertures, defining solder deposit volumes with apertures in a third resist layer, said apertures in said third resist layer being overlapped with apertures in said second resist layer, electroplating solder materials in said apertures in said second and third resist layers to form solder deposits, stripping said second and third resist layers, selectively etching exposed portions of said ball limited metallurgy material, reflowing said solder deposits in accordance with remaining ball limited metallurgy materials, wherein stripping said first resist layer is performed subsequent to said reflowing step, and etching exposed portions of said conductive layer.

2. A method as recited in claim 1, further including the step of patterning said first resist layer subsequent to said reflowing step and prior is stripping said first resist layer, and etching exposed portions of said conductive layer.

3. A method as recited in claim 1, wherein said step of defining solder deposit volumes includes the step of laminating said third resist layer, in sheet form, over said second resist layer.

4. A method as recited in claim 1, wherein said ball limited metallurgy material comprises at least one layer comprising at least one material selected from the group consisting of TiW, CrCu, Cu, Cr, Ni, Co, Au, Pt, and Pd and alloys thereof.

5. A method of increasing height of an electroplated solder deposit including the steps of depositing a conductive layer on a surface, defining a volume of a solder deposit with an aperture in a resist layer overlapping an area of a deposit of ball limited metallurgy material exposed by another aperture in a mask, said aperture being over said conductive layer, depositing solder materials in said aperture in said resist layer, removing said resist, removing said ball limited metallurgy material exposed by said solder materials deposited by said depositing step, and reflowing said solder materials in accordance with remaining areas of ball limited metallurgy materials, patterning and selectively stripping said mask layer subsequent to said reflowing step, and etching exposed portions of a conductive layer.

6. A method as recited in claim 5, wherein said ball limited metallurgy material comprises at least one layer comprising at least one material selected from the group consisting of TiW, CrCu, Cu, Cr, Ni, Co, Au, Pt, and Pd and alloys thereof.

* * * * *

UNITED STATES PATENT AND TRADEMARK OFFICE
CERTIFICATE OF CORRECTION

PATENT NO. : 5,874,199
DATED : February 23, 1999
INVENTOR(S) : Hariklia Deligianni et al.

It is certified that error appears in the above-indentified patent and that said Letters Patent is hereby corrected as shown below:

On column 4, line 38, delete "20', 20' " and replace with --20, 20'--.

Signed and Sealed this

Twenty-third Day of November, 1999

Attest:

Attesting Officer

Q. TODD DICKINSON

Acting Commissioner of Patents and Trademarks